(12) United States Patent
Pethuraja et al.

(10) Patent No.: US 9,947,824 B1
(45) Date of Patent: Apr. 17, 2018

(54) SOLAR CELL EMPLOYING NANOCRYSTALLINE SUPERLATTICE MATERIAL AND AMORPHOUS STRUCTURE AND METHOD OF CONSTRUCTING THE SAME

(71) Applicant: Magnolia Solar, Inc., Woburn, MA (US)

(72) Inventors: Gopal G. Pethuraja, Albany, NY (US); Roger E. Welser, Providence, RI (US); Elwood J. Egerton, Hot Springs, SD (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 203 days.

(21) Appl. No.: 15/072,519

(22) Filed: Mar. 17, 2016

Related U.S. Application Data

(63) Continuation of application No. 14/548,285, filed on Nov. 19, 2014, now abandoned, which is a
(Continued)

(51) Int. Cl.
*H01L 21/00* (2006.01)
*H01L 31/20* (2006.01)
(Continued)

(52) U.S. Cl.
CPC ...... *H01L 31/202* (2013.01); *H01L 31/02168* (2013.01); *H01L 31/02327* (2013.01);
(Continued)

(58) Field of Classification Search
None
See application file for complete search history.

(56) References Cited

U.S. PATENT DOCUMENTS 4,017,332 A  4/1977  James
4,179,702 A  12/1979  Lamorte
(Continued)

FOREIGN PATENT DOCUMENTS

EP  0300807 A2  1/1989

OTHER PUBLICATIONS

Lin, et al., "Influence of Annealing Temperature on Properties of Cu(In,Ga)(SeS)2 Thin Films Prepared by Co-Sputtering From Quaternary Alloy and In2S3 Targets", "Physica B", 2011, pp. 824-830, vol. 406, Publisher: Elsevier, Published in: US.

(Continued)

*Primary Examiner* — Shaun Campbell
(74) *Attorney, Agent, or Firm* — Loginov & Associates; William A. Loginov

(57) ABSTRACT

A solar cell employing nanocrystalline superlattice material and amorphous structure and method of constructing the same provides improved efficiency when converting sunlight to power. The photovoltaic (PV) solar cell includes an intrinsic superlattice material deposited between the p-doped layer and the n-doped layer. The superlattice material is comprised of a plurality of sublayers which effectively create a graded band gap and multi-band gap for the superlattice material. The sublayers can include a nanocrystalline Si:H layer, an amorphous SiGe:H layer and an amorphous SiC:H layer. Varying the thickness of each layer results in an effective energy gap that is graded as desired for improved efficiency. Methods of constructing single junction and parallel configured two junction solar cells include depositing the various layers on a substrate such as stainless steel or glass.

6 Claims, 7 Drawing Sheets

Related U.S. Application Data continuation of application No. 13/081,970, filed on Apr. 7, 2011, now Pat. No. 8,969,711.

(51) Int. Cl.
*H01L 31/0224* (2006.01)
*H01L 31/0232* (2014.01)
*H01L 31/0352* (2006.01)
*H01L 31/0216* (2014.01)
*H01L 31/18* (2006.01)

(52) U.S. Cl.
CPC ........... *H01L 31/022441* (2013.01); *H01L 31/022466* (2013.01); *H01L 31/035245* (2013.01); *H01L 31/035254* (2013.01); *H01L 31/1884* (2013.01)

(56) References Cited

U.S. PATENT DOCUMENTS

| | | | |
|---|---|---|---|
| 4,255,211 A | 3/1981 | Fraas | |
| 4,598,164 A | 7/1986 | Tiedje et al. | |
| 8,647,912 B2* | 2/2014 | Okamoto | H01L 21/02381 136/255 |
| 8,859,885 B2* | 10/2014 | Vermeersch | H01L 31/02008 136/251 |
| 2004/0182433 A1* | 9/2004 | Terakawa | H01L 31/03762 136/255 |
| 2006/0180197 A1* | 8/2006 | Gui | H01G 9/2031 136/255 |
| 2008/0230122 A1* | 9/2008 | Terakawa | H01L 31/0236 136/261 |
| 2009/0165839 A1 | 7/2009 | Zeman et al. | |
| 2009/0211627 A1* | 8/2009 | Meier | H01L 31/068 136/255 |
| 2009/0260681 A1 | 10/2009 | Yun et al. | |
| 2010/0081260 A1 | 4/2010 | Chen | |
| 2010/0186802 A1* | 7/2010 | Borden | H01L 31/0236 136/255 |
| 2011/0240121 A1 | 10/2011 | Dalal | |
| 2012/0058591 A1* | 3/2012 | Siskavich | H01L 31/06875 438/68 |
| 2012/0108002 A1* | 5/2012 | Lee | C23C 16/44 438/96 |

OTHER PUBLICATIONS

Kowshik, et al., "Microbial Synthesis of Semiconductor CdS Nanoparticles, Their Characterization, and Their Use in the Fabrication of an Ideal Diode", "Biotechnology and Bioengineering", Dec. 6, 2001, pp. 583-588, vol. 78, No. 5, Publisher: Wiley Periodicals, Inc., Published in: US.

* cited by examiner

SOLAR CELL EMPLOYING NANOCRYSTALLINE SUPERLATTICE MATERIAL AND AMORPHOUS STRUCTURE AND METHOD OF CONSTRUCTING THE SAME

RELATED APPLICATIONS

This application is a continuation of co-pending U.S. patent application Ser. No. 14/548,285, filed Nov. 19, 2014, entitled SOLAR CELL EMPLOYING NANOCRYSTALLINE SUPERLATTICE MATERIAL AND AMORPHOUS STRUCTURE AND METHOD OF CONSTRUCTING THE SAME, which is a continuation of U.S. patent application Ser. No. 13/081,970, filed Apr. 7, 2011, now U.S. Pat. No. 8,969,711 and issued on Mar. 3, 2015, entitled SOLAR CELL EMPLOYING NANOCRYSTALLINE SUPERLATTICE MATERIAL AND AMORPHOUS STRUCTURE AND METHOD OF CONSTRUCTING THE SAME, the entire disclosures of each are herein incorporated by reference.

FIELD OF THE INVENTION

The present invention relates to semiconductor-based photovoltaic energy converters, also known as "solar cells", and to a method for manufacturing the same.

BACKGROUND OF THE INVENTION

Photovoltaic (PV) solar cells convert sunlight directly into electricity, and it is desirable to improve the efficiency of a PV solar cell through the particular materials and structure employed. Conventional prior art single junction cells such as those shown in FIGS. 1A and 1B apply a single intrinsic layer to convert sunlight into electricity. FIG. 1A is a single junction nanocrystalline (nc-Si) solar cell and FIG. 1B is a single junction a-Si solar cell. The single junction nc-Si solar cell 100 of FIG. 1A includes a p+ layer 102, a n+ layer 106, and a nc-Si:H layer 104 deposited there between. The nc-Si:H layer 104 has a thickness T1A of approximately 1 to 10 μm. Similarly, the conventional single junction a-Si solar cell 110 of FIG. 1B includes a p+ layer 112, an a-Si:H layer 114 having a thickness T1B of approximately 400 nm, and a n+ layer 116. These solar cells comprised of one layer of active material (nc-Si:H or a-Si:H). These cells, having a single optical bandgap are sensitive only to a limited range of photon energies. Thus, photons with energies below the optical bandgap energy are not absorbed at all. Moreover, the energy of photons in excess of the optical bandgap energy is dissipated as heat in the solar cell. In order to increase the efficiency of energy conversion of solar cells, it is desirable to match the energy gap of the material of the solar spectrum. Therefore, the ability to select the energy gap of the material for a solar cell structure maximizes the efficiency of the solar cell.

The efficiency can be increased by cascading active material into a multijunction solar cell, so that each active layer is responsive to a different region of the solar spectrum. For example, refer to U.S. Pat. Nos. 4,017,332, 4,179,702, and 4,255,211. This approach has several technical weaknesses such as limited material availability, device complexity, current matching and high cost to manufacture. Also, as the current output of a series connected solar cell is limited by the sub cell generating the least amount of photo current. The performance of multi junction device is highly susceptible to air-mass index dependent difference in the solar spectrum.

It is therefore desirable to provide a semiconductor device that includes materials which overcome the problems described herein while improving efficiency of the semiconductor device.

SUMMARY OF THE INVENTION

This invention overcomes the disadvantages of the prior art by providing a solar cell that employs a nanocrystalline superlattice material in which the individual sublayers of the superlattice are constructed to provide improved electronic properties. The band-gap of the superlattice layer is controlled by varying the thickness and type of material used for the individual sublayers. The solar cell device parameters, open circuit voltage, short circuit and fill factor are tuned independently by manipulating number of quantum barriers, quantum wells and thickness of transport medium. In an illustrative embodiment, the nanocrystalline superlattice material comprises multi-layered low, mid and wide band gap semiconductor materials wherein the effective energy gap is a graded and multi-energy gap. The graded and multi energy gap can be obtained by varying the thickness and number of layers of low and wide band gap individual layers, and including an upper and lower surface, a first layer of n-doped microcrystalline silicon forming a heterojunction with the lower surface, and a p-doped microcrystalline silicon forming a heterojunction with the upper surface. Photo-generated charge travel distance can be manipulated by fabricating two junction parallel configured device, resulting effective collection of all the charges at electrodes.

The semiconductor device includes an active region including a superlattice with amorphous material and alternating high mobility nanocrystalline material. The amorphous layers contain the energy gap that has a predetermined value. An illustrative embodiment of the device is a solar cell having amorphous SiGe and SiC layers with an absorption coefficient that is higher than in the nanocrystalline silicon layer. The amorphous layers embedded in the nanocrystalline layers are too thin and remain unaffected the photo-generated charge transport between adjacent nanocrystalline layers. Therefore, all of the photogenerated charge carriers are transported to respective p+ or n+ electrodes, thereby resulting in higher short circuit current and open circuit voltage.

A method for fabricating a single junction solar cell in accordance with illustrative embodiments described herein provides a substrate onto which a back reflector layer is fabricated. Then a bottom p+ layer is formed, and an amorphous Si:H buffer layer is fabricated thereon. Then two sets of superlattice absorbers are fabricated, which absorbs full spectrum of sunlight and generate electron-hole pars. The first set of multiband superlattice absorber layers fabrication involves SiGe:H quantum wells and nanocrystalline Si:H transport medium. The second set of multiband superlattice fabrication involves SiC:H quantum barrier layers and nanocrystalline Si:H transport medium. Finally, a n+ layer is deposited through which photogenerated electrons are collected. The bottom p+ layer collects the photogenerated holes. The resulting solar cell exhibits high efficiency by improving absorption of sunlight through targeting the band gaps of the materials to generate a desired effective energy gap.

A method for fabricating a two junction parallel junction solar cell in accordance with illustrative embodiments described herein provides a transparent substrate onto which a TCO layer is fabricated on both sides by 180 degree rotation of substrate. The rotation axis is the diameter for a circular substrate. Then P-I-N structure is fabricated on each side. Top and bottom TCO contacts are fabricated on top and bottom device sides respectively. Finally, back reflection layer on bottom electrode and nanostructured anti-reflection layer on top electrode are fabricated. The resulting solar cell exhibits high efficiency by improving absorption of sunlight through targeting the band gaps of the materials to generate a desired effective energy gap and effective collection of photo-generated charges at electrodes.

BRIEF DESCRIPTION OF THE DRAWINGS

The invention description below refers to the accompanying drawings, of which.

DETAILED DESCRIPTION

Improved efficiency of solar cells is achieved by employing a nanocrystalline superlattice material having a combination of sublayers. According to illustrative embodiments, the superlattice material has an effective energy gap that is graded from the collective combination of sublayers. The term nanocrystalline as used herein refers to the size of crystals or crystalline region being in the scale of nanometers. In an illustrative embodiment, in the nanocrystalline silicon layer, the silicon crystals are in the range of size from approximately 5 to 15 nm embedded in an amorphous silicon matrix.

Figures 1A, 1B:
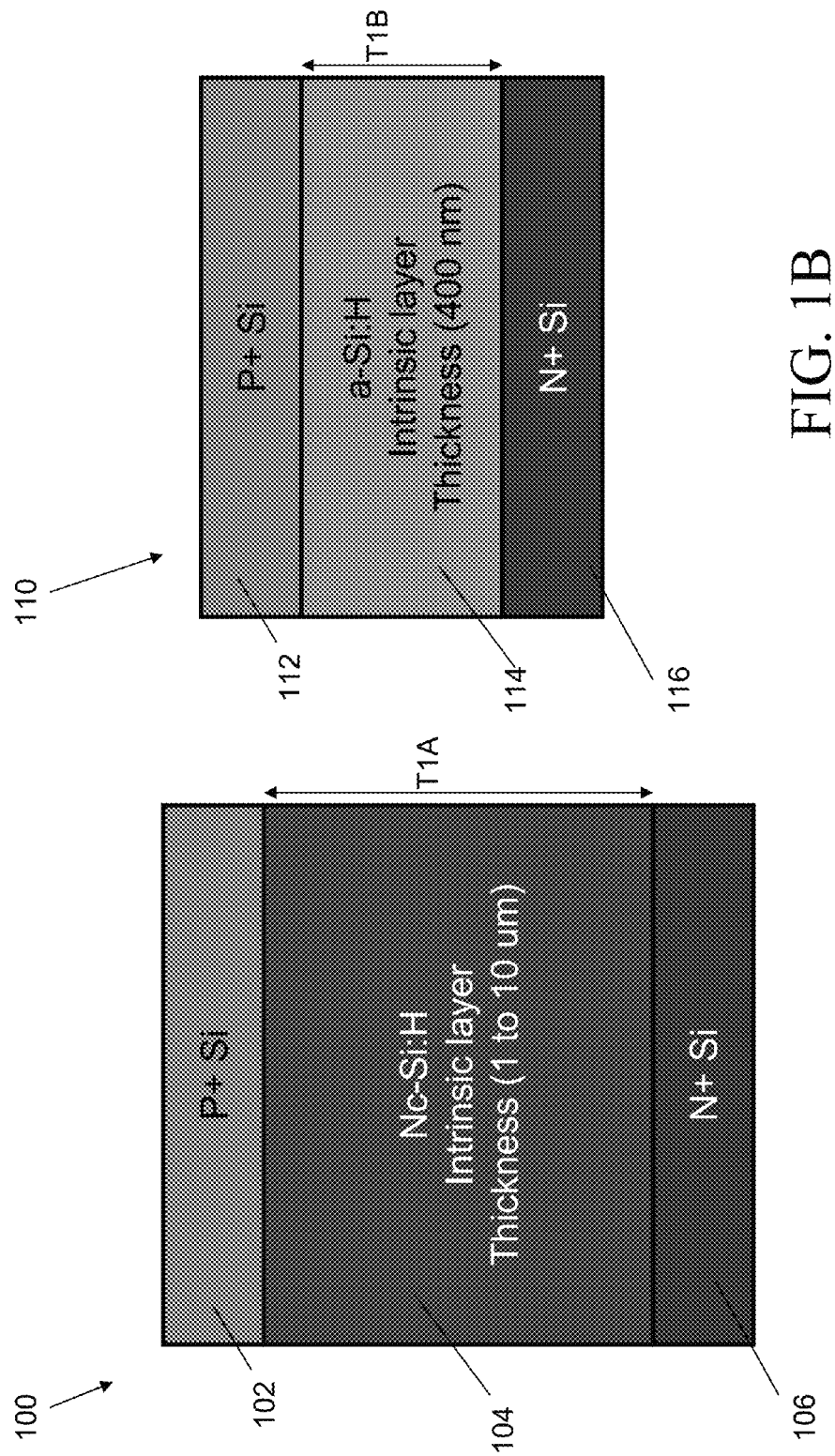
FIG. 1A, already described, is a schematic cross-sectional view of a solar cell device according to a prior art embodiment having a conventional single junction nc-Si:H intrinsic layer.
FIG. 1B, already described, is a schematic cross-sectional view of a solar cell device according to a prior art embodiment having a conventional single junction a-Si:H intrinsic layer.
Figure 2:
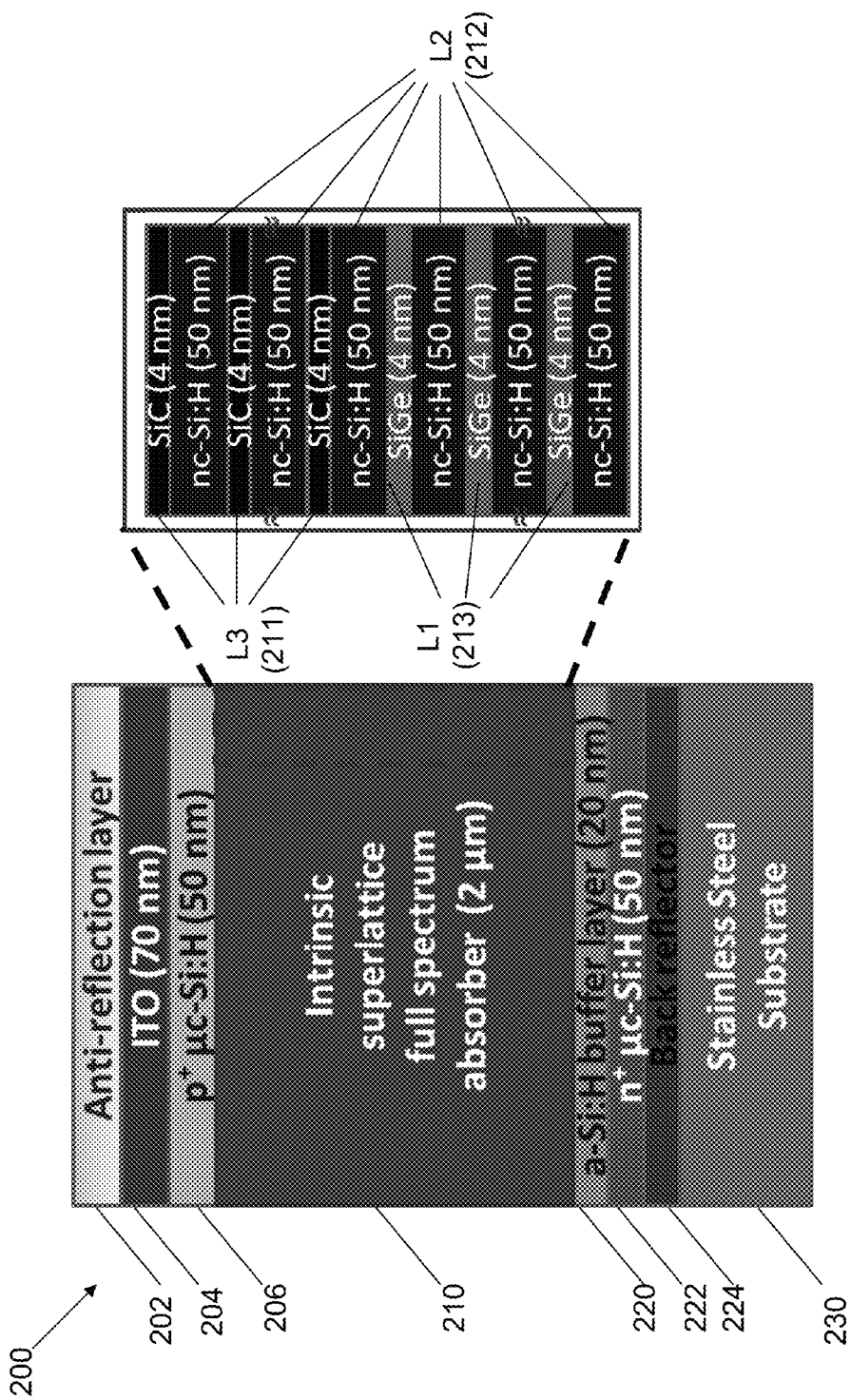
FIG. 2 is a schematic cross-sectional view of a solar cell device according to an illustrative embodiment incorporating a nanocrystalline supperlattice material having a combination of sublayers.

Reference is made to FIG. 2, showing a schematic cross-sectional view of a solar cell device 200, incorporating a nanocrystalline superlattice material 210, according to an illustrative embodiment. The solar cell structure is illustratively fabricated on a stainless steel substrate 230, however other substrates readily apparent to those skilled in the art can be readily employed. As shown in FIG. 2, the solar cell 200 includes a top anti-reflection layer 202 which is deposited on an ITO layer 204 which has a thickness of approximately 70 nm. The ITO layer 204 is deposited on a p+ or p-doped layer 206 which is deposited on the nanocrystalline superlattice material 210. The structure and method of construction for the superlattice material layer 210 is described in greater detail with reference to FIGS. 3 to 5 hereinbelow.

As shown in FIG. 2, the nanocrystalline material 210 includes a first sublayer L1 (213) that is intertwined with a second sublayer L2 (212) and a third sublayer L3 (211) is also intertwined with the second sublayer L2 (212). The first sublayer L1 (213) is comprised of amorphous SiGe film (a-SiGe:H) having a band gap of approximately 0.8 eV. The a-SiGe:H layer L1 results in quantum confinement induced mini bands in the conduction band of SiGe. Therefore, photons of energy of approximately 0.8 eV and above are absorbed which leads to creation of electron-hole pairs (for example see electron-hole pair 314 of FIG. 3). These charges are separated by the electrostatic force induced by n+ and p+ electrodes in the films yielding photocurrent. The lower band gap materials of L1 yield higher current density. The second sublayer L2 (212) is comprised of a hydrogenated nanocrystalline layer of Si:H (nc-Si:H) and has a higher mobility and a band gap of approximately 1.1 eV. The photons of approximately 1.1 eV and above are absorbed which leads to creation of electron-hole pairs (for example see electron-hole pair 312 of FIG. 3). These charges are separated by the electrostatic force induced by the fabricated n+ and p+ electrodes yielding photocurrent. The higher mobility materials of layer L2 yield higher fill factor. The third sublayer L3 (211) is comprised of amorphous SiC (a-SiC:H) and has a band gap above 2 eV. This film also has quantum confinement which induces intermediate bands within the forbidden gap of SiC. Thus, photons of energy of approximately 2 eV, above and slightly below are absorbed and lead to creation of electron-hole pairs (for example see electron-hole pair 316 of FIG. 3). These charge carriers are separated by the electrostatic force induced by the n+ and p+ electrodes yielding photocurrent. The wider band gap material of layer L3 yields higher voltage.

Figure 3:
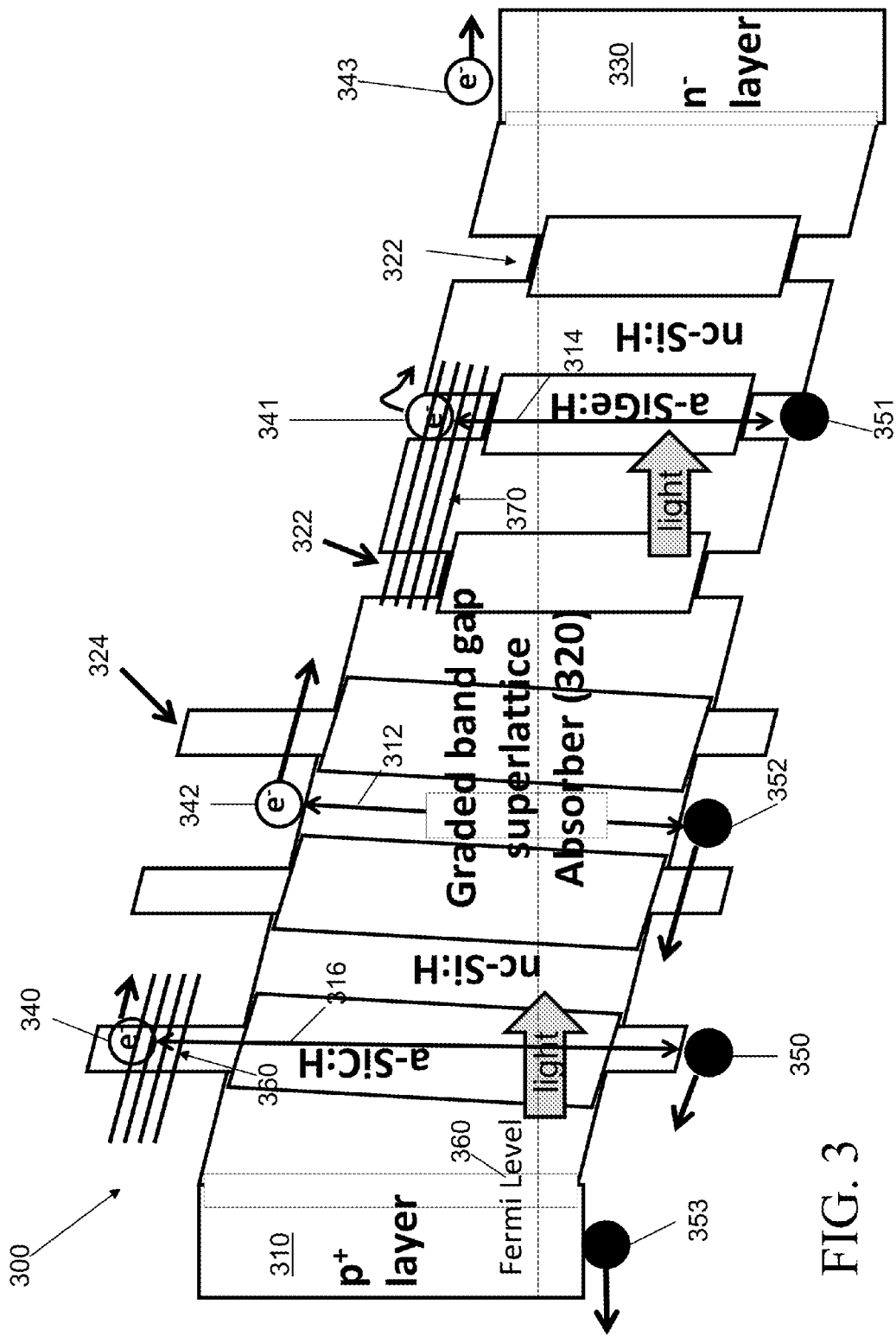
FIG. 3 is a diagram of the energy band versus position for the thin film solar cell device according to illustrative embodiments.
Figure 4:
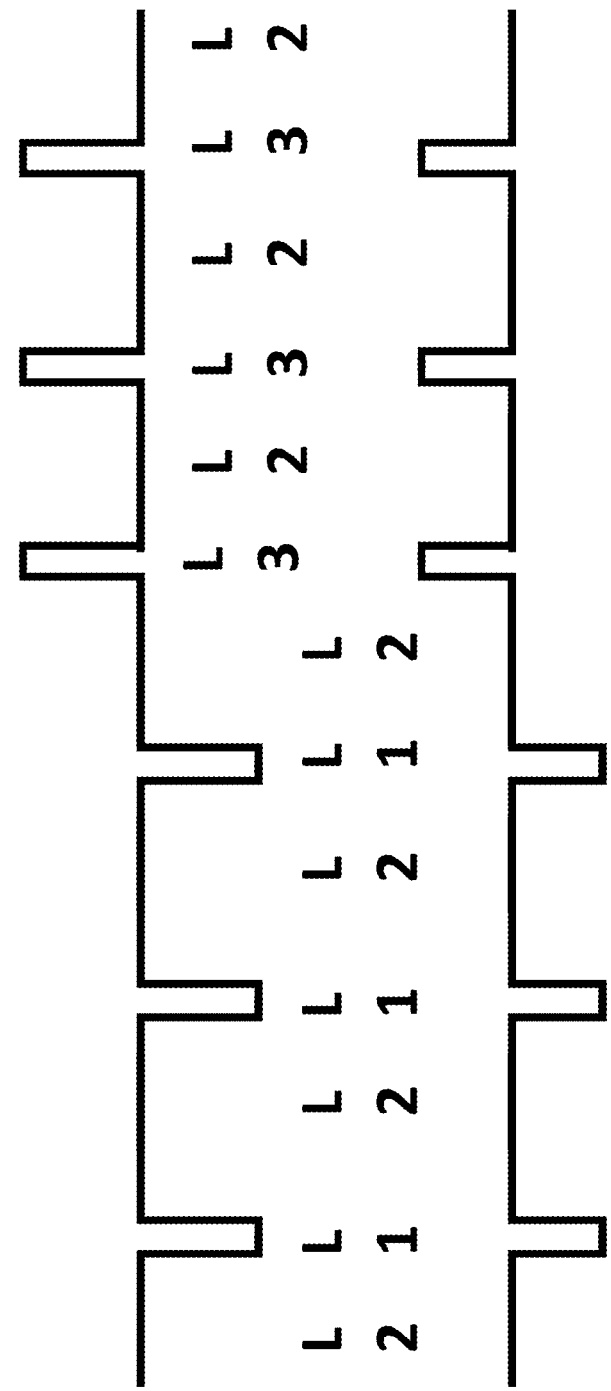
FIG. 4 is a diagram of the combination of sublayers of the nanocrystalline superlattice, according to the illustrative embodiments.

Reference is now made to FIGS. 3 and 4, showing the superlattice material and its sublayers in greater detail. FIG. 3 is a diagram of the energy band versus position for the solar cell device, and FIG. 4 details the combination of sublayers of the superlattice material. As shown in FIG. 3, the solar cell 300 includes a p+ layer 310, which is similar to the p+ layer 206 and a n− layer 330, which is similar to the n− layer 222 of FIG. 2. The superlattice absorber material 320 is disposed between the p+ layer 310 and the n− layer 330 of the solar cell 300. As described herein, the superlattice is comprised of a multi-layered material which includes a first sublayer of nc-Si:H which is layered with a-SiGe:H to create quantum wells, and a-SiC:H to create quantum barriers. Note the quantum well 322 generated by the a-SiGe:H sublayer and the quantum barrier 324 generated by the a-SiC:H sublayer. The electrons 340, 341, 342 and 343 each have corresponding holes 350, 351, 352 and 353 which generate electron-hole pairs for efficiently producing energy in accordance with the solar cell described herein. Quantum confinement effect creates intermediate bands 360 and mini bands 370. The electron 341 at the mini band utilize thermal energy or low energy photons to raise to the conduction band of nc-Si:H layer. The barrier layers 324 are thin enough and the electron 342 easily tunnel through it. The p+ 310 and n+ 330 layers create electrostatic driving force that drive the electron and holes to n+ and p+ layer respectively.

FIG. 4 is a diagram of the combination of sublayers of the nanocrystalline superlattice. The second sublayer L2 is the nc-Si:H layer which is deposited throughout the nanocrystalline superlattice as described herein. This is a mid-gap semiconductor material consisting mostly of nanocrystalline silicon that has high mobility and high current density. It transports charges to electrodes effectively, yielding enhancement in fill factor. The first sublayer L1 is the a-SiGe:H layer which is a low band gap semiconductor material also known as a quantum well layer, which enhances charge carrier population. The third sublayer L3 is the a-SiC:H layer which is a wide gap semiconductor material also known as a quantum barrier layer. This sublayer L3 increases the operating voltage of the cell.

Figure 5:
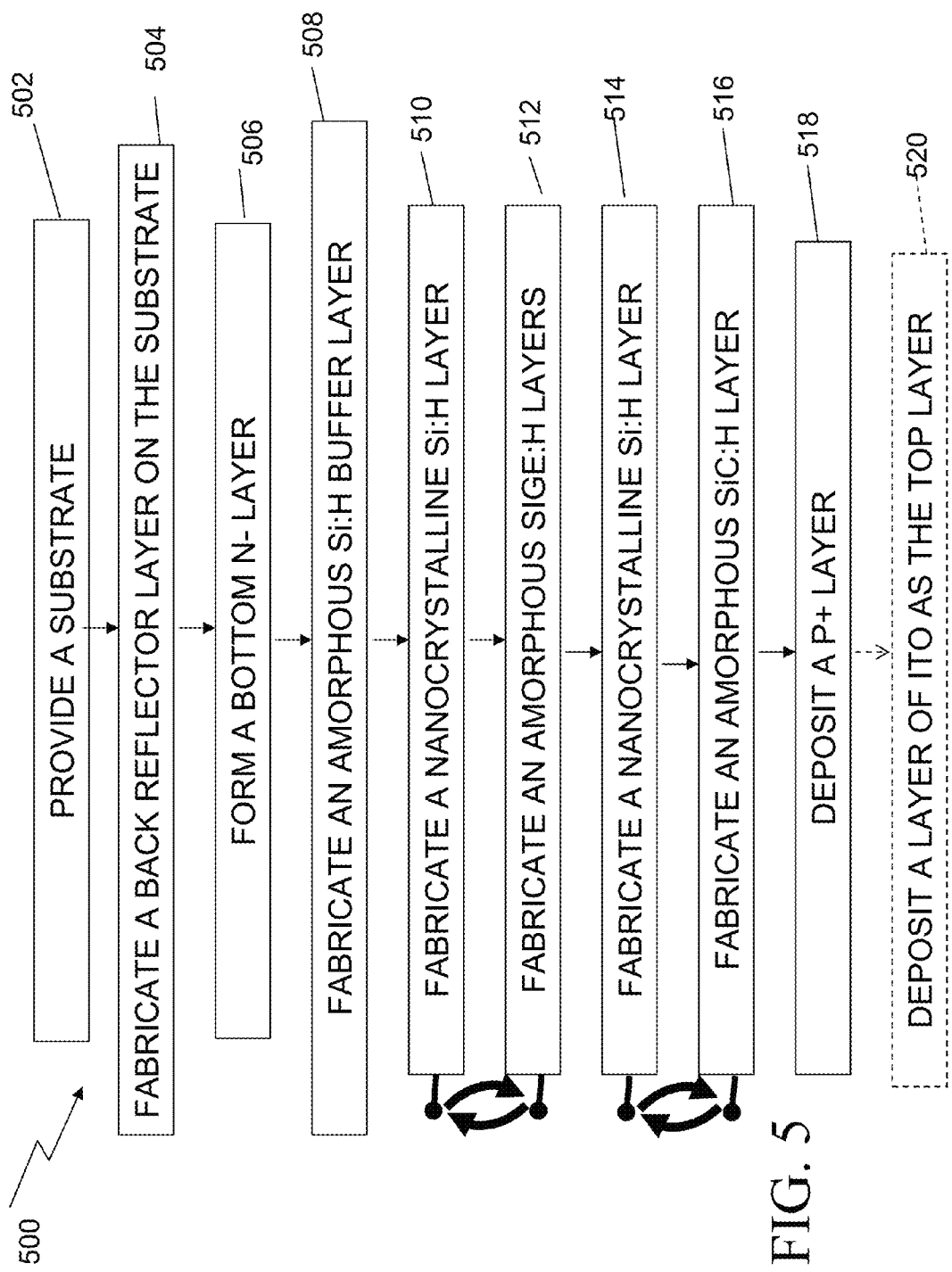
FIG. 5 is a flow chart of a procedure for manufacturing a solar cell in accordance with illustrative embodiments.

A flow chart of a procedure 500 for fabricating or otherwise manufacturing a solar cell having an amorphous and nanocrystalline superlattice structure is illustrated in FIG. 5. According to the procedure 500 for manufacturing the solar cell, a substrate is provided first at step 502, and then at step 504 a back reflector layer is fabricated. Then at step 506 a bottom n− layer is formed, an then an amorphous Si:H buffer layer is fabricated at step 508. The buffer layer eliminates mixing of n type dopant in the nc-Si:H layer during formation. Then a nanocrystalline Si:H layer is fabricated at step 510 and amorphous SiGe:H layer is fabricated at step 512 which creates quantum well layer. The step 510 and 512 repeated for approximately 20 to 50 times that creates first set of superlattice. The lower bandgap quantum well layer yields higher short circuit current.

In the next stage of fabrication an nanocrystalline Si:H layer is fabricated at step 514 and next an amorphous SiC:H layer is fabricated fabricated at step 516, which creates quantum barrier. The steps 514 and 516 are repeated approximately 20 to 50 times that creates the second set of superlattice. The wider band gap barrier layer yields higher voltage.

Finally at step 518 a p+ layer is deposited. The light from the sun is absorbed in the superlattice layer described herein. The quantum well and barrier induced mini and intermediate bands generates extra electron-hole pairs. Internal electrostatic force drive electrons to n+ layer and holes to p+ layer.

In order to create an optimized solar cell device structure, there are several parameters to be considered in fabricating the device. In the superlattice layer, three different absorption coefficient layers are periodically stacked. The number of nanocrystalline layers are based on optical transmittance and absorption analysis, which results in approximately 40 nc-Si layers in the superlattice absorber. The nanocrystalline layer consists of nm sized crystals embedded in the amorphous matrix. In the nanocrystalline layer, amorphous and crystalline volume ratio of approximately 50% is optimal. A layer of ITO will serve as the top layer of the solar cell embodiment.

Figure 6:
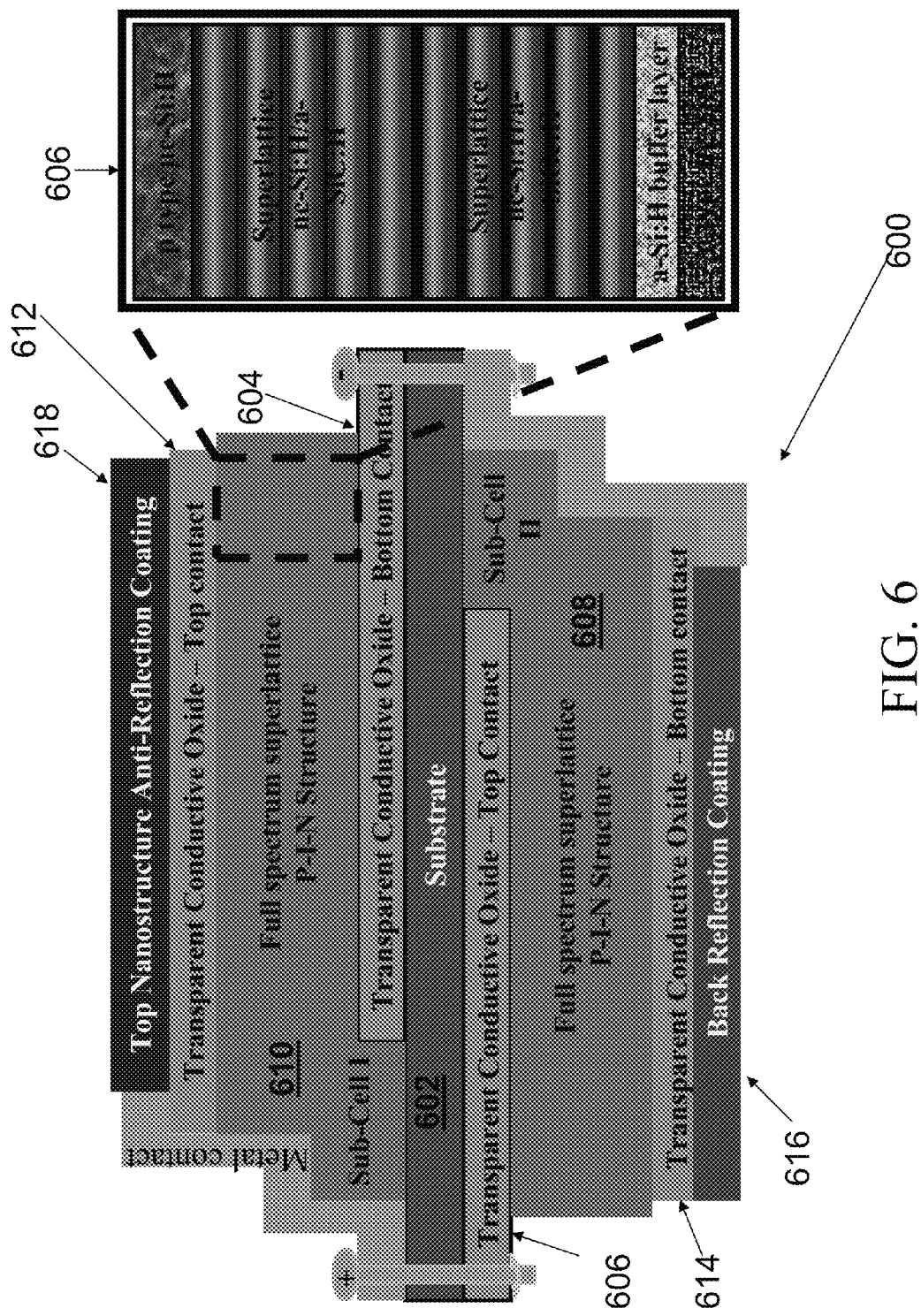
FIG. 6 is a schematic cross-sectional view of a two junction parallel configuration solar cell in accordance with the illustrative embodiments.
Figure 7:
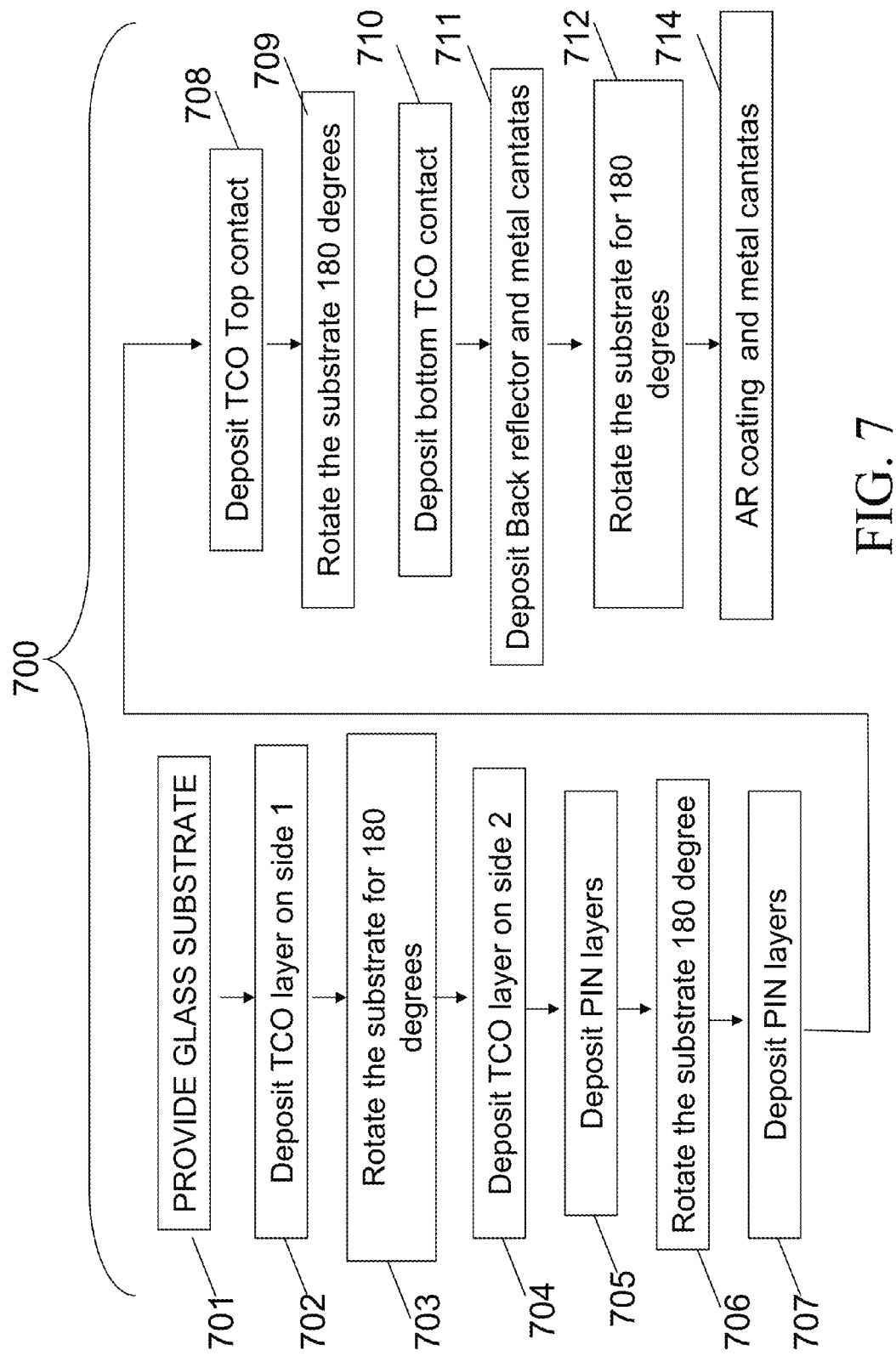
FIG. 7 is a flow chart of a procedure for fabricating the two junction parallel configuration solar cell in accordance with the illustrative embodiments.

Transport of charge carrier without loss is significant for realizing high efficiency device. An optimized a-SiC:H quantum barrier layer will yield a higher and uniform internal electric field and hence increases drift lengths ($L_{drift}=\mu\tau E$) of charge carriers. For effective collection of charge carriers, thickness of intrinsic layer should be comparable to the drift length ($t_{L-layer} > L_{drift}$). The thickness of the intrinsic layer can be reduced to achieve optimal carrier collection. In single junction cell, reduction of intrinsic layer thickness leads higher light transmission without generating electron-hole pairs. Reference is made to FIG. 6 showing a schematic cross-sectional view of a two junction parallel configuration cell that reduces the thickness of the intrinsic layer to achieve optimal carrier generation and collection. Unutilized light by the top cell can be effectively harvested by the bottom cell. This two junction parallel configured tandem cell can be fabricated in a fraction of cost required for fabricating the conventional tandem cell. Our novel cell design has 180 degrees rotational symmetry. Each film deposition as shown in the procedure 700 of FIG. 7 is continued on each side of the substrate by rotating the low cost glass substrate. In this approach, two sub-cells are fabricated in a single load. The manufacturing expense will be thus be much less expensive than requiring two sub-cells to be fabricated individually.

With reference to FIGS. 6 and 7, a two junction parallel configuration tandem cell 600 is fabricated by first providing a substrate 602 at step 701. The substrate can be glass or any other appropriate transparent substrate in accordance with the illustrative embodiments. Next, at step 702, a TCO layer 604 is deposited on a first side (Sub-Cell I) of the substrate. The substrate is then rotated 180 degrees at step 703 and then a layer of TCO 606 is deposited on the second side (Sub-Cell II) of the substrate at step 704. The P-I-N layers are then deposited at step 705, with a P-I-N structure 608 deposited on the TCO layer 606. The structure is then rotated 180 degrees at step 706 and a P-I-N structure 610 is deposited on the TCO layer 604 at step 707. The P-I-N structures 608 and 610 are the superlattice structure as described herein, shown in detail as layer 606 in FIG. 6.

At step 708 of the procedure, a TCO layer 612 top contact is deposited and the substrate is then rotated 180 degrees at step 709. Then at step 710 a TCO layer 614 is deposited and at step 711 the metal contacts and back reflector 616. The structure is again rotated 180 degrees at step 713 and the top AR coating 618 is deposited at step 714.

Various illustrative embodiments and methods of constructions have now been described, and the structure and construction will be apparent to those having ordinary skill. The solar cell includes a superlattice material and can be any combination of sublayers to achieve solar cell efficiency as described herein. The applications and implementations should be readily apparent to those skilled in the art.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A method of fabricating a photovoltaic (PV) device having 180 degree symmetry, comprising:
    (a) depositing a first transparent conductive oxide (TCO) layer on a first side of a substrate;
    (b) rotating the substrate by 180 degrees;
    (c) depositing a second TCO layer on the second side of the substrate;
    (d) depositing a first PIN structure on the second TCO layer;
    (e) rotating the substrate by 180 degrees;
    (f) depositing a second PIN structure on the first TCO layer;
    (g) depositing a third TCO layer on the second PIN structure;
    (h) rotating the substrate by 180 degrees; and
    (i) depositing a fourth TCO layer on the first PIN structure.

2. The method of claim 1, wherein the substrate is transparent.

3. The method of claim 1, wherein the substrate comprises glass.

4. The method of claim 1, further comprising:
    (j) depositing a back reflector on the fourth TCO layer;
    (k) rotating the substrate by 180 degrees; and
    (l) depositing an anti-reflective coating on the third TCO layer.

5. The method of claim 1, wherein (d) depositing a first PIN structure on the second TCO layer further comprises:
    (d1) depositing a bottom n− layer;
    (d2) depositing an amorphous Si:H buffer layer;
    (d3) depositing a first nanocrystalline Si:H layer;
    (d4) depositing an amorphous SiGe:H layer;
    (d5) repeating (d3) and (d4) between 20-50 times;
    (d6) depositing a second nanocrystalline Si:H layer;
    (d7) depositing an amorphous SiC:H layer;
    (d8) repeating (d6) and (d7) between 20-50 times; and
    (d9) depositing a top p+ layer.

6. The method of claim 1, wherein the first PIN structure is identical to the second PIN structure.

* * * * *